(12) United States Patent
Stoddard et al.

(10) Patent No.: US 9,315,917 B2
(45) Date of Patent: Apr. 19, 2016

(54) APPARATUS AND METHOD FOR THE PRODUCTION OF INGOTS

(75) Inventors: Nathan Stoddard, Beaverton, OR (US); Wilfried von Ammon, Österreich (DE)

(73) Assignee: Solar World Industries America Inc., Hillsboro, OR (US)

(*) Notice: Subject to any disclaimer, the term of this patent is extended or adjusted under 35 U.S.C. 154(b) by 575 days.

(21) Appl. No.: 13/561,350

(22) Filed: Jul. 30, 2012

(65) Prior Publication Data

US 2014/0030501 A1 Jan. 30, 2014

(51) Int. Cl.
| | |
|---|---|
| *B32B 7/02* | (2006.01) |
| *C30B 11/00* | (2006.01) |
| *C30B 11/04* | (2006.01) |
| *C30B 13/00* | (2006.01) |
| *C30B 29/06* | (2006.01) |

(52) U.S. Cl.
CPC .............. *C30B 11/001* (2013.01); *C30B 11/04* (2013.01); *C30B 13/005* (2013.01); *C30B 29/06* (2013.01); *Y10T 117/1068* (2015.01)

(58) Field of Classification Search
CPC ...... C30B 29/06; C30B 11/001; C30B 11/04; C30B 11/14; C30B 13/005; Y10T 117/1068
USPC ................................ 428/220; 117/15, 217, 34
See application file for complete search history.

(56) References Cited

U.S. PATENT DOCUMENTS

| | | | | |
|---|---|---|---|---|
| 4,224,100 | A | * | 9/1980 | Hartzell .......................... 117/81 |
| 4,572,812 | A | | 2/1986 | Ciszek |
| 5,528,620 | A | | 6/1996 | Fujita et al. |
| 6,027,563 | A | | 2/2000 | Choudhury et al. |
| 2003/0145781 | A1 | | 8/2003 | Von Ammon |

FOREIGN PATENT DOCUMENTS

| | | |
|---|---|---|
| DE | 44 35 764 A1 | 4/1995 |
| EP | 1 930 483 A1 | 6/2008 |

OTHER PUBLICATIONS

Korean Office Action of Jun. 25, 2014.
"Dislocation Etch for (100) Planes in Silicon": F. Secco d' Aragona: Journal of the Electrochemical Society, vol. 119, p. 948 (1972).

* cited by examiner

*Primary Examiner* — Aaron Austin
*Assistant Examiner* — Lawrence Ferguson
(74) *Attorney, Agent, or Firm* — McGlew and Tuttle, P.C.

(57) ABSTRACT

Apparatus and method for a crucible-less production of silicon ingots, wherein a support with a seed layer and a liquid layer is gradually lowered in a temperature field with a vertical gradient to solidify the liquid layer in a controlled way.

9 Claims, 9 Drawing Sheets

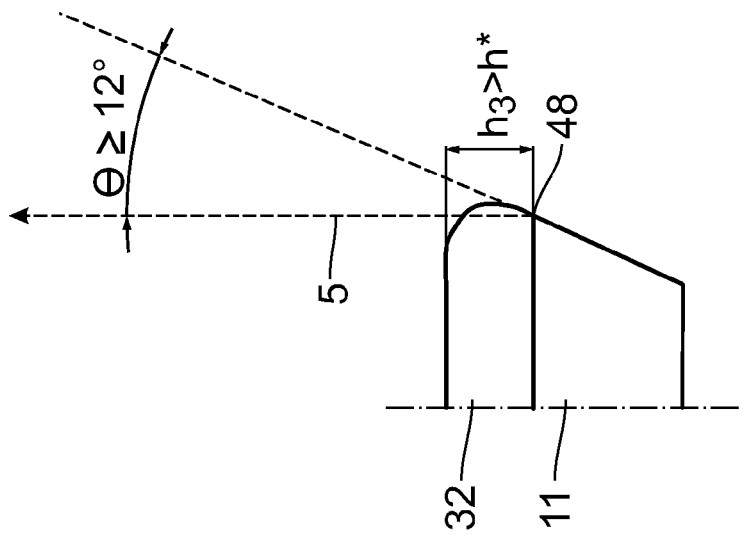
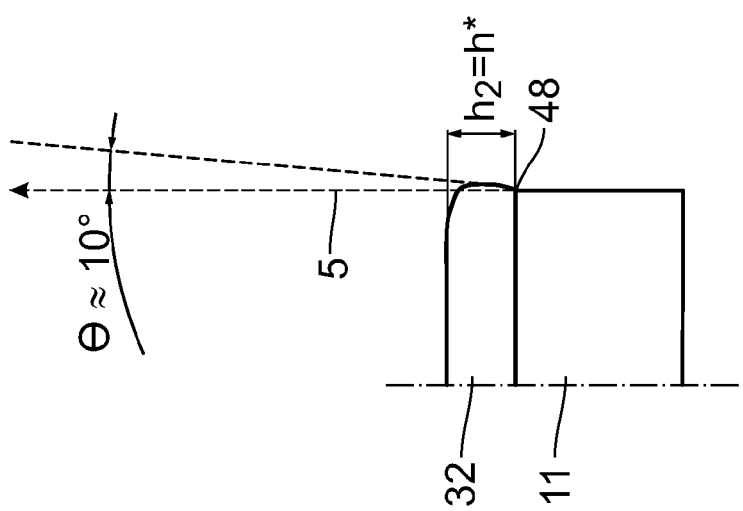
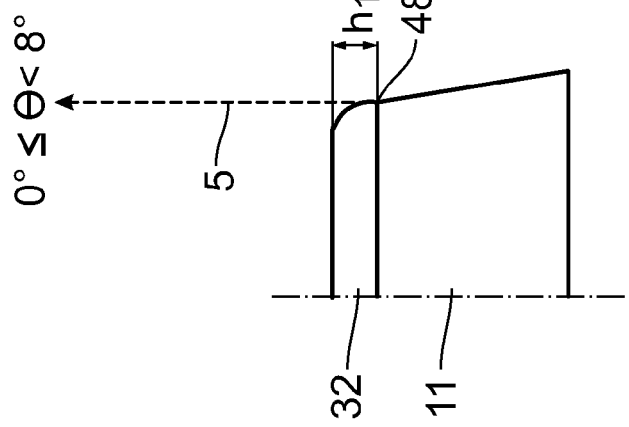

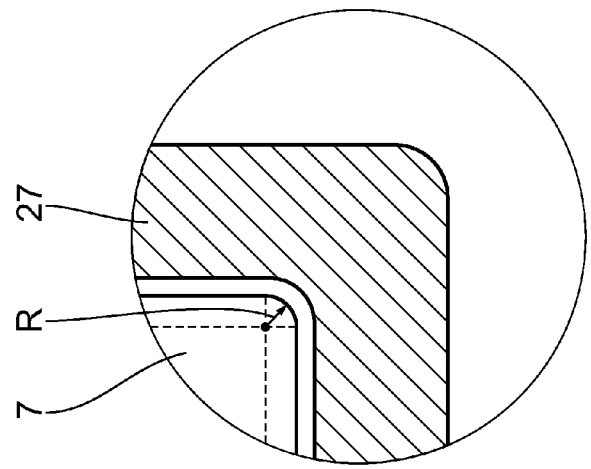
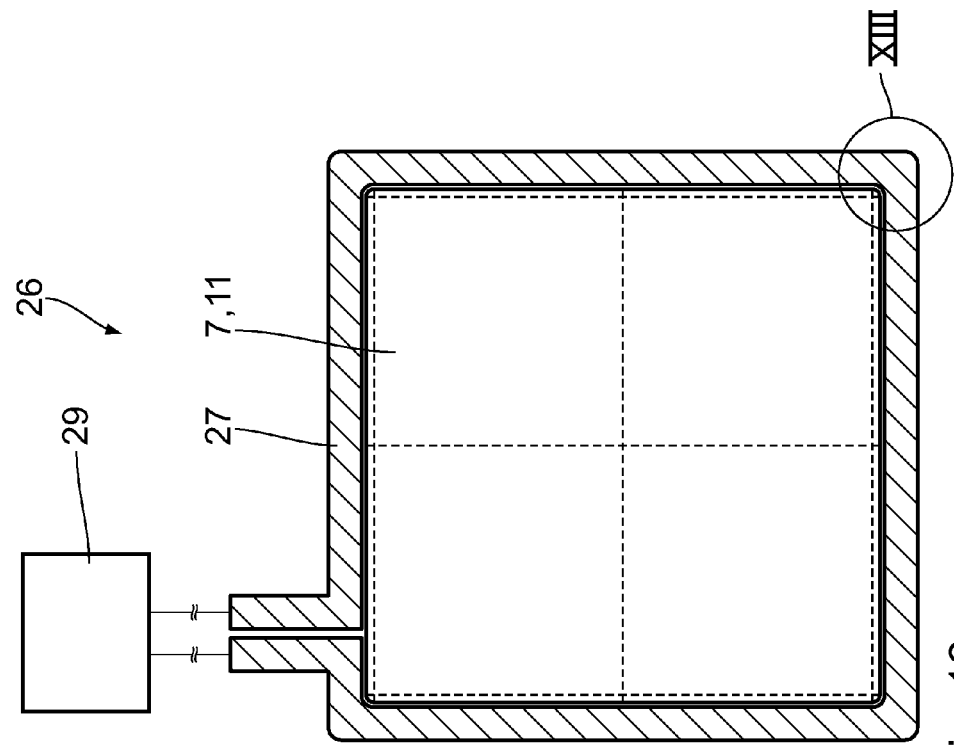

APPARATUS AND METHOD FOR THE PRODUCTION OF INGOTS

FIELD OF THE INVENTION

The invention relates to an apparatus and a method for the production of ingots.

BACKGROUND OF THE INVENTION

Techniques for bulk growth of crystals, especially those made from silicon, include float zone (FZ), Czochralski (Cz) and multicrystalline (mc) growth. Each of these methods has drawbacks and limitations.

SUMMARY OF THE INVENTION

It is an object of the invention to provide an apparatus and a method to facilitate the production of ingots.

This object is solved by an apparatus for the production of ingots comprising, a chamber to provide a controllable atmosphere, wherein the chamber has a top and a bottom spaced apart from each other in a vertical, i.e. longitudinal direction, a support for supporting a seed layer, wherein the support is movable in the longitudinal direction relative to the chamber, at least one means for controlling a temperature field in a given volume of growth in the chamber, wherein the temperature field has a temperature gradient in the longitudinal direction, and a feeding apparatus for controllable feeding of material onto the seed layer. This object is further solved by a method for the production of ingots comprising the steps of providing an apparatus with a chamber to provide a controllable atmosphere, at least one means for controlling a temperature field with a temperature gradient in a longitudinal direction in a given volume of growth inside the chamber, a support for a seed layer, the support being movable in the longitudinal direction inside the chamber (with respect to the internal hot zone) and a controllable feeding apparatus for providing feedstock, providing a seed layer on the support, wherein the seed layer defines a cross-sectional area of an ingot to be produced, moving the support, such that the seed layer is located at a predetermined position within the volume of growth, generating a temperature field with a predetermined vertical temperature gradient within the volume of growth, providing feedstock on the seed layer by way of the feeding apparatus, wherein the feeding of feedstock and the temperature field within the volume of growth are controlled such that the entire seed layer is covered with a layer of liquid feedstock, lowering the support with respect to the hot zone in concert with the solidification of the layer of liquid feedstock, being cooled from below. The motion of the support plate is controlled to be roughly equal and opposite to the motion of the solidification interface.

The core of the invention is to provide an apparatus for the production of ingots with at least one means for generating a temperature gradient in a longitudinal direction inside a chamber and a support for supporting a seed layer, which support is movable in the direction of the temperature gradient, and a feeding apparatus for controllable feeding of material onto the roughly flat seed crystal layer.

The apparatus is in particular suited for the production of silicon-ingots. The apparatus is in particular suited for a crucibleless production of ingots. The liquid feedstock on the seed layer is in particular freestanding, i.e. there are no crucibles, vessels or cold wall crucibles for containing the liquid feedstock.

According to an aspect of the invention the seed layer comprises at least one seed plate arranged on the support. The seed plate is preferably made of silicon. It preferably has a monocrystalline structure. It can be made of monocrystalline silicon. Advantageously, it can be made of an ingot produced according to the method of the present invention.

The seed layer can comprise several seed plates, in particular several seed crystals. The seed plates are preferably arranged in a regular pattern on the support. They preferably form a tiling of a predescribed area on the support. The seed plates preferably have a given crystal structure, in particular a given orientation.

The seed layer preferably has a cross-sectional area corresponding to that of the ingots to be produced. The seed layer has in particular the same cross-sectional shape as the ingots to be produced. The cross-sectional area of the seed layer is in particular within 20% of that of the final ingot.

The seed layer preferably has a cross-sectional area of at least $0.04$ $m^2$, in particular at least $0.1$ $m^2$, in particular at least $0.2$ $m^2$, in particular at least $0.4$ $m^2$. It can be rectangular, in particular square. Preferably, it has flat side lengths, which are integer multiples of a wafer size.

The outer perimeter of the seed layer preferably has rounded corners. The corners preferably have radii R of at least 1 mm, in particular of at least 3 mm.

According to another aspect of the invention the at least one means for controlling the temperature field in the chamber comprises at least one top heating apparatus arranged above the support for the seed layer.

The heating apparatus is arranged on the opposite side of the seed plate from the support. It is controllable, in particular by a control device. The control device can be part of an open loop or a closed loop control system. The heating apparatus can be inductive or resistive.

According to another aspect of the invention the top heating apparatus is designed to generate a temperature field with a temperature gradient in a direction perpendicular to the longitudinal direction.

According to another aspect of the invention the at least one top heating apparatus comprises at least two heating loops, which are independently controllable. Each of the heating loops is connected to a power source providing at least one of a DC power signal and an AC power signal According to another aspect of the invention the at least two heating loops are arranged concentrically. The at least two heating loops have different perimeters, such that one heating loop forms an outermost heating loop, and wherein the outermost heating loop has a weaker heating power than at least one other heating loop.

According to another aspect of the invention the at least one means for controlling the temperature field comprises at least one bottom cooling apparatus arranged below the support for the seed layer. The top heating apparatus and the bottom cooling apparatus are in particular arranged on opposite sides of the seed layer with respect to the longitudinal direction.

The bottom cooling apparatus is preferably controllable. It enables a controlled variation in the strength of heat removal.

According to another aspect of the invention at least one of the top heating apparatus and the bottom cooling apparatus is designed such that a lateral temperature gradient in a volume of growth is at most 1 K/cm, in particular at most 1 K/m, in particular at most $10^{-1}$ K/m. The temperature gradient is preferably controllable.

The temperature gradient in the longitudinal direction is preferably controllable. It lies in the range of 100 K/m to 10000 K/m, in particular in the range of 300 K/m to 3000 K/m.

According to another aspect of the invention the apparatus further comprises at least one perimeter heater. The perimeter heater preferably has an inner perimeter matching or nearly matching an outer perimeter of the seed layer in shape, with a slightly longer length. By this it is understood that there is a gap, preferably with a width in the range of 0.2 mm to 10 mm, in the lateral directions, i.e. perpendicular to the longitudinal direction, between the seed layer and the perimeter heater.

The perimeter heater preferably comprises an inductive heating element. This can be a fluid cooled coil, in particular a water or gas cooled coil. The coil can be made of copper or another material which is refractory to at least the melting temperature of silicon. On the other hand, no cooling is necessary, and the heating element may be a solid length of a suitable material. The two ends of the perimeter heater are connected to a power supply comprising an AC-power source as well as optionally a DC-power source.

The inductive perimeter heater forms an electromagnetic containment coil. The magnetic field produced by the perimeter heater induce countercurrents in the conductive liquid silicon. The heater current and silicon countercurrent interact through electromagnetic forces, leading to a repulsion of the liquid silicon away from the heater. By that, the perimeter heater can control the cross-section of the ingot to be produced in a nearly conformal manner. It enables in particular a contactless control of the ingot cross-section.

According to another aspect of the invention the apparatus further comprises at least one perimeter cooler. The perimeter cooler preferably has an inner perimeter matching an outer perimeter of the seed layer in shape. By this it is understood that there is a gap, preferably with a width in the range of 0.2 mm to 20 mm, in the lateral directions between the seed layer and the perimeter cooler.

The perimeter cooler can be built as perimeter cooling loop. The perimeter cooler can comprise a tube which enables a cooling fluid, in particular a cooling liquid or cooling gas circulation through it. The perimeter cooling is spaced apart from the seed layer in the radial direction. By this it can be ensured that it is not in physical contact with the ingot. The perimeter cooler forms an edge cooling loop.

According to another aspect of the invention the perimeter heater is arranged above the perimeter cooler with a distance in the longitudinal direction of at most 10 cm. The perimeter heater is preferably arranged next to the perimeter cooler. It is in particular arranged with a distance to the perimeter cooler of at most 5 cm, in particular of at most 3 cm.

The perimeter heater and the perimeter cooler can have the same or nearly the same cross-section in the lateral directions. They can in particular be arranged concentrically to the longitudinal axis that penetrates the center of the cross-section, but with a longitudinal offset as described above. Apart from the connections they can display a rotational symmetry, in particular a discrete, in particular four-fold, rotational symmetry. Without restriction, the rotational symmetry could also be two-fold, with a rectangular cross-section. It is desirable for the cross-section to be rectangular or square such that it can be subdivided with minimal waste into one or more rectangular or square bricks for the purpose of cutting substrates that can be arranged for efficient space-filling in a solar module. A lack of symmetry is not excluded, but will not be as efficient.

According to another aspect of the invention the apparatus further comprises a gas inlet. The gas inlet is admittable with an inert gas, in particular Argon, from an inert gas reservoir.

The gas inlet is arranged above the seed layer. It is designed to allow an even flow of inert gas across the seed layer and/or the liquid material on top of the seed layer, respectively.

According to another aspect of the invention the feeding apparatus preferably comprises a means for melting silicon. Thus, the apparatus according to the invention comprises two different temperature control systems, one for melting the feedstock and one for the solidification thereof. By that, the flexibility in heat flux control is enhanced. It is possible that small pieces of solid silicon could be added to the liquid layer on top of the seed layer, but the system can be more robust in operation and flexible in feedstock type if the solid is melted elsewhere and provided in liquid form to the solidification section on an as-needed basis.

The feeding apparatus may in particular be arranged outside the chamber. Thus, feedstock, in particular liquid feedstock, can be added to the chamber, in particular to the seed layer, from outside the chamber.

According to another aspect of the invention the apparatus is crucibleless.

According to another aspect of the invention the feeding apparatus comprises an outlet, the position of said outlet relative to the seed layer being adjustable.

According to the method according to the present invention a seed layer defining a cross-sectional area of an ingot to be produced is provided on a support and the support is moved to a predetermined position within a temperature field with a predetermined vertical temperature gradient. Then, feedstock is provided on the seed layer by way of a feeding apparatus, wherein the feeding of feedstock and the temperature field within a volume of growth are controlled such that the entire seed layer is covered with a layer of liquid silicon. Then, the support is lowered, that is moved in a direction parallel to the temperature gradient, in particular in the direction of decreasing temperature, as the layer of liquid feedstock solidifies due to the heat energy being removed from the bottom. In other words, after the system is brought into initial equilibrium with a static, stable liquid layer above the seed layer, the thermal balance is changed by decreasing the heating from above, increasing the cooling from below, or both. This is what drives the solidification interface upwards, and the support layer is simultaneously drawn downward in an effort to maintain the solid/liquid interface within a given vertical range.

The method advantageously operates according to a feed as you need principle. By that, the volume of liquid silicon needed is greatly reduced and, therefore, the process safety is enhanced.

According to an aspect of the invention the temperature field in the volume of growth is controlled such that the seed layer assumes a temperature within 100° C. of its melting temperature. The seed layer in particular assumes a temperature within 100° C. of its melting temperature at the beginning of the process, in particular, before feedstock is provided on the seed layer by the feeding apparatus.

It is possible to increase the vertical temperature gradient, i.e. the temperature gradient in the longitudinal direction during an initial phase, in particular, after the seed layer is covered completely with a layer of liquid feedstock. The vertical temperature gradient can be increased in a way such that a solid-liquid phase boundary between the seed layer and the feedstock layer does not move. In other words, the vertical temperature gradient is increased in a way such that there is no net solidification.

According to another aspect of the invention the amount of feedstock provided onto the seed layer is adjusted such that the liquid layer of feedstock has a predetermined height. The rate of providing feedstock onto the seed layer is in particular adjusted to keep the liquid height constant whilst the support is lowered. The rate of providing feedstock is in particular adjusted to the strength of the net heat removal and the rate of lowering the support.

The height of the liquid phase can be kept constant in the range of 1 mm to 10 cm, in particular in the range of 5 mm to 2 cm.

According to an aspect of the invention the feedstock is provided by the feeding apparatus in form of liquid feedstock. The feedstock can be provided at a temperature in the range of 1410° C. to 1500° C., in particular in the range of 1420° C. to 1450° C.

The feedstock is preferably provided onto the seed layer near the center of the seed layer with respect to its cross-section.

According to another aspect of the invention the containment of the liquid feedstock on the seed layer, otherwise based only on the high surface tension, is aided by the electromagnetic field generated by the perimeter heater. Preferably, the extra heat being induced by the perimeter heater is countered by the perimeter cooler, in particular by the perimeter cooling loop, which is preferably located just below the perimeter heater. The combination of the perimeter heater and the perimeter cooler help to define the solidification front at the edge within a narrow space. Generally, the thermal gradient at the edge may be steeper than in the middle of the ingot due to the perimeter heater and cooler, but the shape of the solid-liquid interface is preferably as flat as possible.

According to another aspect of the invention a phase boundary between solidified feedstock and liquid feedstock is held stationary whilst the support is lowered.

By the special arrangement of the top heater and the bottom cooler, in particular by suitable control of at least one of the top heater and the bottom cooler, a flat phase boundary, that is a flat solidification interface, is maintained.

In particular, at least one of the top heater and the bottom cooler are controlled such that the temperature field in the volume of growth has a lateral temperature gradient of at most 1 K/cm, in particular of at most 1 K/m, in particular of at most $10^{-1}$ K/m.

According to another aspect of the invention feedstock, liquid feedstock is continuously applied whilst the support is lowered. Feedstock is in particular continuously applied to keep the height of the liquid feedstock layer constant as the advancing solidification tends to shorten the liquid layer from the bottom.

According to another aspect of the invention for the adding of liquid feedstock from the feeding apparatus an outlet of said feeding apparatus is adjusted to reach into the layer of liquid feedstock.

According to another aspect of the invention the chamber is purged of air and back-filled with an inert gas. This is preferably done at the beginning of the process, in particular, before liquid feedstock is fed onto the seed plate.

According to another aspect of the invention the temperature field is controlled in a way, such that a lateral temperature gradient in the volume of growth ($V_g$) is at most 10 K/mm.

According to another aspect of the invention the apparatus further consists of a fluid heat exchanger that is capable of varying the heat extraction rate from the cooling apparatus from zero to full cooling power.

According to another aspect of the invention the cross-sectional shape of the seed layer and perimeter heater are rectilinear, having basically straight sides at roughly 90 degrees to one another and rounded corners with a radius of at least 1 mm and where the seed layer is laterally positioned to fit within the cross-section of the perimeter heater.

According to another aspect of the invention the lateral size of the ingot is controlled during growth by monitoring the gap between the seed crystal and the perimeter heater, and controlling the current in the perimeter heater as needed to increase or decrease the cross-sectional area of the liquid feedstock.

According to another aspect of the invention the rate of solidification is actively controlled by monitoring the position of the liquid/solid interface and using an active feedback control loop on the net energy flux between the heating apparatus and the cooling apparatus.

According to another aspect of the invention the feedstock material is included in the group of: silicon, germanium, gallium arsenide, aluminum oxide, indium arsenide, silicon germanium, other semiconductors, polymers and transition metal oxides with a liquid phase.

According to another aspect of the invention a predefined flow pattern is generated in the layer of liquid feedstock by application of a time varying current to a top heating apparatus.

According to another aspect of the invention the time varying currents in the top heater are controlled such that at least during some periods the flow pattern in the layer of liquid feedstock is such, that there is a flow of liquid feedstock from a central part of the layer to the corners.

According to another aspect of the invention the solidifying layer of liquid feedstock is monitored by a monitoring apparatus.

According to another aspect of the invention depending on a signal from the monitoring apparatus an activation of at least one of the at least one means for controlling the temperature field in the volume of growth ($V_g$), a rate of adding liquid feedstock from the feeding apparatus, an activation of a perimeter heater, an activation of a perimeter cooler and a rate of lowering the support is controlled.

According to another aspect of the invention depending on a signal from the monitoring apparatus the height of the layer of liquid feedstock is adjusted.

Further aspect and details of the invention will be described with reference to FIGS. 1 to 13.

BRIEF DESCRIPTION OF THE DRAWINGS

FIG. 12 shows a top view of a ring heater surrounding the solidifying ingot and FIG. 13 shows a magnified view of section XIII of FIG. 12.

DESCRIPTION OF THE PREFERRED EMBODIMENTS

Figure 1:
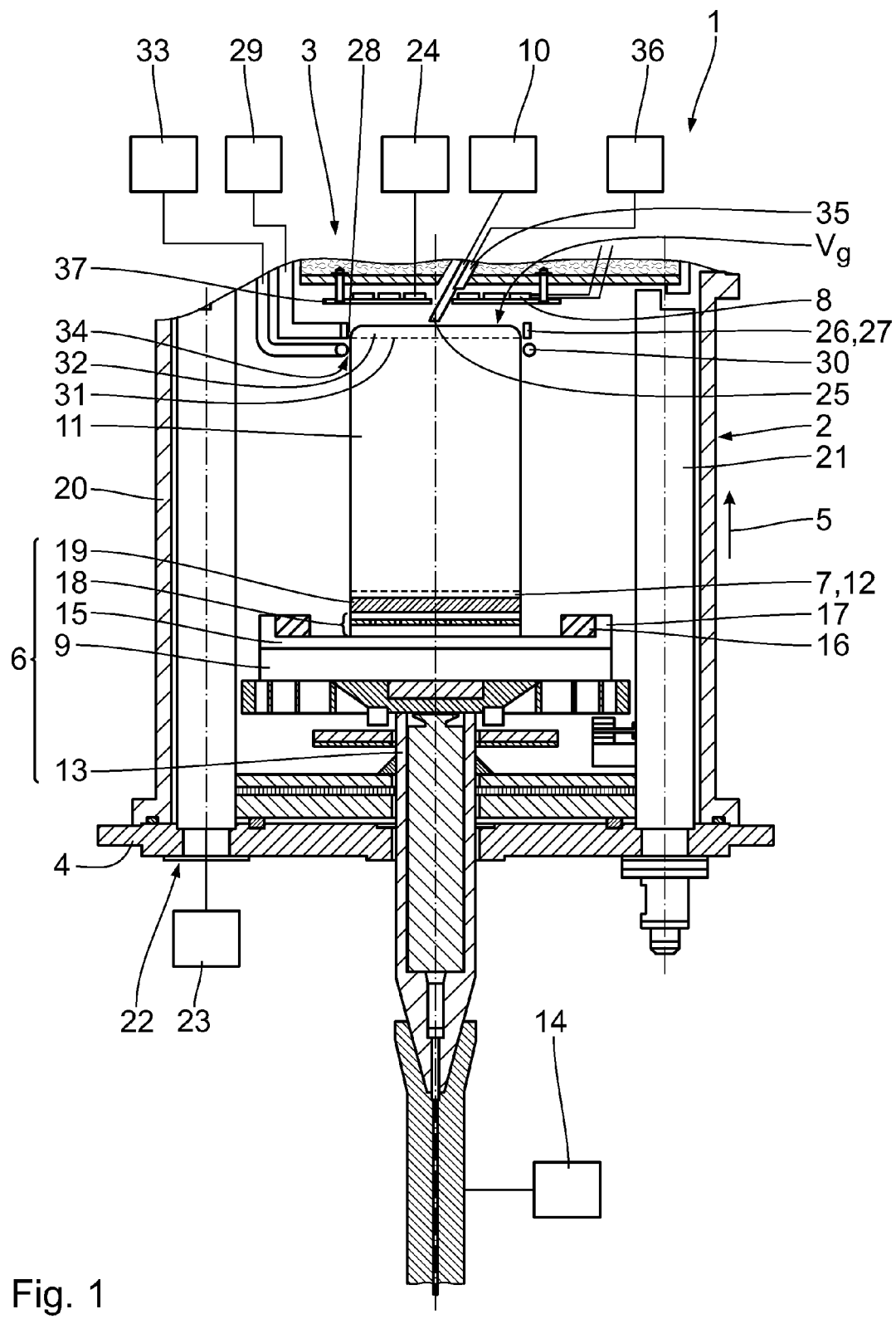
FIG. 1 shows a sectional view of an embodiment of the invention.

According to an embodiment shown in FIG. 1, an apparatus 1 for the production of ingots, in particular for the production of silicon ingots, comprises a chamber 2 to provide a controllable atmosphere. The chamber 2 has a top 3 and a bottom 4 spaced apart from each other in a longitudinal direction 5.

The bottom 4 of the chamber 2 is built as bottom plate. The top 3 is built as a lid, but could be configured as a thermal separation layer dividing the growth volume from the melting volume. The chamber 2 further comprises a sidewall 20, which extends in the longitudinal direction 5. The sidewall 20 preferably forms a gastight connection with the bottom 4 and optionally with the top 3. Along the sidewall 20 there is arranged a thermal insulation 21. The insulation 21 can be made of alumina fiber, carbon fiber, or any other suitable thermal insulator.

In the bottom 4 of the chamber 2 there is an exhaust 22. The chamber 2 is connected to a gas exchange apparatus 23 by way of the exhaust 22. It thus provides a controllable atmosphere. The gas exchange apparatus 23 can be a vacuum device to evacuate the chamber 2. In general, the gas exchange apparatus 23 forms a means for controlling the atmosphere inside the chamber 2.

Furthermore the apparatus 1 comprises a support 6 for supporting a seed layer 7 and a silicon block 11 solidifying on top of the seed layer 7. The support 6 is movable in the longitudinal direction 5 relative to the chamber 2.

The apparatus 1 further comprises a heating apparatus 8 and a cooling apparatus 9. The heating apparatus 8 and the cooling apparatus 9 form means for controlling a temperature field in a given volume of growth $V_g$ in the chamber 2. They are in particular means for controlling a temperature field with a temperature gradient in the longitudinal direction 5.

Furthermore the apparatus 1 comprises a feeding apparatus 10 for controllable feeding of material onto the seed layer 7 or onto the already solidified silicon block 11 on the seed layer 7, respectively. In the latter case it is also understood that the material is fed onto the seed layer 7.

The seed layer 7 comprises one or more seed plates 12. The seed plates are preferably made of single crystal material, but may be ordered arrangements of crystals. They are in particular of silicon, in particular monocrystalline silicon. The one or more seed plates 12 may be cut from a single block of silicon.

The seed layer 7 has a cross-sectional area which corresponds to that of the ingots to be produced. It preferably has a rectangular, in particular a square, cross-sectional area with rounded corners. The seed layer 7 has an outer perimeter shape free of sharp corners. It has in particular corner radii R of at least 1 mm, in particular of at least 3 mm.

The cross-sectional area of the seed layer 7 has side lengths in the range of between 20 cm to 80 cm, in particular in the range of 30 cm to 65 cm. In principle, there is no limit on the dimensions of the cross-sectional area. The side lengths preferably are integer multiples of side lengths of wafers to be cut from the ingot. The seed layer 7 preferably has a cross-sectional area of at least 0.05 m$^2$, in particular at least 0.2 m$^2$, in particular at least 0.4 m$^2$.

The support 6 comprises a pedestal 13. The pedestal 13 is mechanically connected to a motion driver 14. It is movable along the longitudinal direction 5 by the motion driver 14. The pedestal 13 has a range of movement in the longitudinal direction 5 of at least 25 cm, preferably at least 40 cm, preferably at least 60 cm. The pedestal column 13 is configured to allow the passage of cooling fluid up to the cooling layer, 9. Alternately, the cooling block may radiate heat through a variable aperture to a fluid cooled surface, such as side wall 20.

The support 6 further comprises a containment tray 15 with a circumferential edge 17. The edge 17 has a height in the longitudinal direction 5 of at least 1 cm, in particular at least 3 cm.

The containment tray 15 has a cross-sectional area in the direction perpendicular to the longitudinal direction 5, which is at least twice as large, in particular at least three times as large as the cross-sectional area of the seed layer 7. The containment tray 15 provides a volume for holding liquid silicon. The volume is at least 1 L, in particular at least 2 L, in particular at least 3 L. The containment tray 15 protects the lower part of the chamber 2 and the pedestal 13 from a spill of liquid silicon.

A sponge-like structure 16 is arranged along the circumferential edge 17, and may fill the entire volume. The sponge-like structure 16 forms a sponge to soak up spilt silicon.

The support 6 can optionally further comprise a heater and insulator stack 18 arranged on top of the containment tray 15. The heater and insulator stack 18 is arranged between the cooling apparatus 9 and the seed layer 7.

The support 6 further comprises a support plate 19. The support plate 19 can be made of graphite or silicon carbide or even silicon. The seed layer 7 is arranged on top of the support plate 19. Preferably, the seed layer 9 and the support plate 19 have cross-sectional areas differing of at most 10%, in particular of at most 5%, in particular of at most 1%.

The cooling apparatus 9 can also be part of the support 6. It is arranged in between the pedestal 13 and the containment tray 15.

The heating apparatus 8 is arranged above the seed layer 7. It is thus arranged on the opposite side of the seed layer 7 from the pedestal 13. The heating apparatus 8 can be inductive or resistive in type. The heating apparatus 8 has an outer cross-sectional area in the direction perpendicular to the longitudinal direction 5, which is within 40% of the cross-sectional area of the seed layer 7, and may be slightly larger or smaller. It is designed to generate a temperature field with a negligible net lateral temperature gradient in the ingot. The lateral temperature gradient in the ingot can preferably be controlled to be at most 10K/m, in particular at most 1 K/m, in particular at most 10$^{-1}$ K/m.

The heating apparatus 8 is controllable by a power controller 24.

The heating apparatus 8 can be made of silicon carbide coated graphite. It can be supported by a support layer 37. In case of an inductive heating apparatus 8 the support layer 37 can be made of alumina or quartz. In case of a radiative heating apparatus 8 the support layer 37 can be made of silicon carbide (SiC), SiC-coated graphite or boron nitrite (BN) coated graphite. A support layer 37 made of silicon carbide (SiC) or SiC-coated graphite is fabricated in a way that the SiC does not shortcut heater loops. The support layer 37 is in particular electrically isolated from the heating apparatus 8. The support layer 37 also serves to reduce the risk of contamination of the heating apparatus 8 with liquid silicon. Alternately, the heater may be suspended by its power leads and hang freely over the melt.

The cooling apparatus 9 preferably allows a controlled variation in the strength of heat removal. The cooling apparatus 9 forms a cooling sink. It can be built as heat exchanger block. It can comprise active, controllable elements, for example means for enabling a controllable circulation of a cooling fluid within the heat exchanger block.

The cooling apparatus 9 is designed such that a lateral temperature gradient in the volume of growth $V_g$ can be controlled to be at most 1 K/cm, in particular at most 1 K/m, in particular at most 0.1 K/m.

The feeding apparatus 10 comprises a feed tube 25 for feeding liquid silicon onto the seed layer 7 or the already solidified silicon block 11, respectively. The feeding apparatus 10 comprises a reservoir for holding liquid silicon. It can comprise a means for melting silicon. The liquid silicon fed into the chamber 2 by the feeding apparatus 10 is referred to as feedstock for the silicon ingot to be produced.

The apparatus 1 further comprises a perimeter heater 26. The perimeter heater depicted here comprises a single-turn inductive heating coil 27. The perimeter heater 26 has an inner perimeter closely conforming to an outer perimeter of the seed layer 7, except at the corners of the cross-section, where the perimeter heater may diverge from the ingot. There is a gap 28 with a width in the range of 0.2 mm to 10 mm in between the outer perimeter of the seed layer 7 and the inner perimeter of the perimeter heater 26. The heating coil 27 is electrically connected to a power supply comprising an AC power source 29 and optionally a DC power source. The heating coil 27 may be a water-cooled copper coil. Alternatively it may consist of a refractory material capable of carrying the AC power from the AC power source 29 and operating at elevated temperatures, in particular at temperatures up to at least the melting temperature of silicon, in particular up to at least 1450° C. The gap 28 between the liquid and the heater can be controlled by the strength of the magnetic field, which is controlled by the current applied to the heater. Because the radius of the liquid surface is smaller at the corners, and the electromagnetic field is also enhanced, the space gap between the perimeter heater and the liquid may increase in the corners. This may be compensated by shaping the perimeter heater to bulge out at the corners, diverging from the seed crystal shape there. An observation device looking at the gap may be placed into feedback with the perimeter heater power to maintain the gap spacing within a desired control range.

The apparatus 1 further comprises a perimeter cooler 30. The perimeter cooler 30 is designed as a cooling loop. It is located just below an intended solidification line 31, i.e. a phase boundary between the already solidified silicon block 11 and a layer 32 of liquid feedstock on top of that. The perimeter cooler 30 is used to closely control the thermal gradient at the solidification front. It can comprise a tube which is in fluid connection to a reservoir 33 for a cooling fluid, in particular a cooling liquid or cooling gas. This cooling fluid can circulate through the tube of the perimeter cooler 30.

The perimeter cooler 30 is arranged adjacent to the perimeter heater 26 in the longitudinal direction 5. It is arranged just below the perimeter heater 26. Preferably, the perimeter heater 26 is arranged above the perimeter cooler 30 with a distance in the longitudinal direction 5 of at most 10 cm, in particular at most 5 cm, in particular at most 3 cm.

The perimeter cooler 30 can have an identical inner cross-sectional area as the perimeter heater 26, or it may more closely conform to the ingot shape. Preferably the perimeter cooler 30 has an inner perimeter matching the outer perimeter of the seed layer 7. By this, it is understood that there is a gap 34 with a width in the range of 0.2 mm to 10 mm in a lateral direction between the perimeter cooler 30 and the outer perimeter of the seed layer 7 or the already solidified silicon block 11, respectively. In other words, the perimeter cooler 30 is spaced apart from the silicon block 11. Thus, it is not in direct physical contact with the silicon block 11.

The apparatus 1 further comprises a gas inlet 35 which is connected to a gas reservoir 36. The gas inlet 35 is admittable with an inert gas from the gas reservoir 36. Argon can be used as inert gas. The gas inlet 35 is arranged above the seed layer 7. It is arranged at the top 3 of the growth chamber 2. The gas inlet 35 is designed to enable a even flow of an inert gas across the layer 32 of liquid silicon. Thus, it is suited to sweep away silicon oxide (SiO) gas.

In the following the use of the apparatus 1 according to the invention is described. The apparatus 1 is used in a method for the production of a silicon block 11, which is also referred to as silicon ingot 11. Although the method will be described for silicon, it also applies to a variety of other crystalline materials, semiconducting, insulating or metallic in nature.

First, the apparatus 1 according to the preceding description is provided. In particular, the chamber 2 with at least one means for controlling the temperature field with the temperature gradient in the longitudinal direction 5 in the volume of growth $V_g$ inside the chamber 2 and the support 6 for the seed layer 7 and the controllable feeding apparatus 10 is provided. The seed layer 7 is placed on the support 6. It is in particular placed on the support plate 19.

The seed layer 7, in particular one or more seed plates 12 are placed on the support plate 19 on top of the cooling apparatus 9.

Then, the pedestal 13 is brought up such that the seed layer 7 is close to the perimeter heater 26. In particular, the seed layer 7 is within a distance of at most 1 cm to the perimeter heater 26, and the top of the seed layer may even exceed the height of the bottom of the perimeter heater. It is arranged such that the lateral gap 28 is even on all sides of the seed layer 7.

The chamber 2 is purged of air and back-filled with an inert gas by the gas exchange apparatus 23.

The heating apparatus 8 is turned on and controlled so that the seed layer 7, in particular the at least one seed plate 12, is heated to within 100° C. of the melting temperature, and preferably within 20° C. of the melting temperature.

Cooling by the cooling apparatus 9 from below can also be effected. However, a vertical temperature gradient is kept low, at most up to a few tens of degrees per centimeter, and more preferably less than 5 K/cm. Furthermore, preferably at least one of the heating apparatus 8 and the cooling apparatus 9 is controlled such that the net lateral temperature gradient is as close to zero as possible. The net lateral temperature gradient in the volume of growth $V_g$ is kept below 1 K/cm, in particular below 1 K/m, in particular below 0.1 K/m.

Then, silicon feedstock is introduced from above by the feeding apparatus 10 via the feed tube 25. It is preferably introduced in the center of the seed layer 7. It is preferably introduced in a melted state, i.e. as a liquid. The feedstock can be doped to the desired resistivity. Feedstock is introduced by the feeding apparatus 10 until the liquid layer 32 covers the entire seed layer 7, in particular the entire seed plate 12. It is introduced until the layer 32 has a liquid column height of a few millimeters up to several centimeters. The liquid height of the layer 32 is in particular in the range of 1 mm to 5 cm, in particular in the range of 3 mm to 2 cm. The layer 32 has a uniform height over the entire cross-section. The feedstock introduced preferably has a temperature in the range of 1410° C. to 1450° C.

The surface tension of silicon is sufficient to contain a liquid head height of the layer 32 up to 6 mm to 10 mm. To enable a layer 32 with a height larger than that electromagnetic containment through AC power supplied from the AC power source 29 to the perimeter heater 26 can be used. It is also possible to produce an ingot without running the perimeter heater 26 if the liquid height of the layer 32 is kept below 8 mm. Furthermore, the perimeter heater 26 may be run in feedback mode to control the lateral dimension of the solidifying silicon block 11.

Once this situation has been established and stabilized, the thermal gradient from the cooling sink, i.e. the cooling apparatus 9, can be increased in tandem with the heat from the heating apparatus 8 from above in order to maintain no net solidification. In other words, the vertical temperature gradient in the volume of growth $V_g$ can be increased in a way such that the solid-liquid phase boundary 31 between the seed layer 7 and the liquid layer 32 of feedstock does not move. The thermal gradient can be adjusted, in particular increased, until a given operating gradient has been reached and stabilized.

Then, the balance of heating and cooling is shifted by a) increasing the cooling from below, b) decreasing the heating from above or c) both of the above. Because of the net heat extraction, the liquid silicon begins to solidify and the solid/liquid interface starts to move up. At this point, the pedestal 13 is lowered to keep the bottom of the liquid layer 32 of feedstock at the same vertical level. At the same time, extra feedstock is introduced from the top by the feeding device 10 to maintain the top of the liquid layer 32 within the desired control range. As the process proceeds, the pedestal 13 is lowered to withdraw the seed layer 7 from the heating apparatus 8 and the feeding apparatus 10. The pedestal 13 is in particular lowered in a way such that the phase boundary 31 between the solidified silicon block 11 and the liquid layer 32 of feedstock is held stationary. Furthermore, by adding feedstock from the feeding apparatus 10 the liquid height of the layer 32 is kept constant whilst the pedestal 13 is lowered. In particular, feedstock is continuously supplied whilst the support 6, in particular the pedestal 13, is lowered. In particular, feedstock is continuously applied to keep the height of the liquid layer 32 of feedstock constant. Thus, the solidification conditions in the volume of growth, in particular at the phase boundary 31, are kept quasi-static. This may be achieved by two different control schemes. In the first case, the heating and cooling balance is kept to a set recipe over time and the pedestal 13 is moved in feedback with the solid/liquid interface position to maintain a quasi-static situation. More preferably, the pedestal 13 may be moved down according to a fixed schedule, and the heater 8 and/or cooling block 9 can be put into feedback with the solid/liquid interface position to maintain a given position.

Whilst the silicon is solidified, a difference in heat flux between the heating apparatus 8 and the cooling apparatus 9 is maintained to equal that of the heat of fusion of the solidifying silicon. In this way the entire cross-section is solidified simultaneously, preferably maintaining a very flat solidification line 31. The solidification line 31 is in particular flat to within less than 10 mm, in particular less than 3 mm, in particular less than 1 mm, in the longitudinal direction 5.

The extra heat being induced by the perimeter heater 26 can be countered by activation of the perimeter cooler 30. This way the solidification front at the edge can be defined within a narrow space.

Once the body of the ingot has been solidified to the desired height, which can be up to more than 1.5 m, the feed of liquid silicon is stopped and the liquid layer 32 is allowed to solidify in a controlled manner. Special care is applied to avoid liquid trapped by solid and dendritic structures. As the top surface of the ingot solidifies, the solid area radiates significantly more heat away than the liquid, due to the abrupt change in emissivity. Without a compensating adjustment, the remaining liquid will begin to be undercooled and may start to solidify dendritically, resulting in higher levels of stress and potentially in trapped liquid. It is possible to increase the heating from above during that phase in order to counter the higher radiated heat flux from the recently solidified material and maintain an orderly end to solidification, preferably moving either from the center out to the corners, or more preferably from the corners in to the center.

At this point, the ingot may be cooled down to near room temperature and removed from the furnace. A new seed layer may be placed in and the process can start over.

There are several advantageous features of the apparatus and process. Foremost is the high purity of ingot that is attainable. The melted feedstock, once delivered, will at no point touch any non-silicon material, excepting the fresh, high purity argon being delivered across the surface. The lack of a crucible means that contaminant levels in the crystal (especially oxygen and iron) can be significantly below what is found in Czochralski and multicrystalline crystal growth methods. The fresh supply of argon sweeping the surface should serve to evaporate most of the oxygen present in the feedstock. This high purity can lead to enhanced minority carrier lifetime and improved solar cell efficiency levels.

The square geometry of the process ensures a high yield of silicon feedstock from the ingots manufactured by this method. Both Cz and FZ methods are limited to the formation of basically round crystals, where 30% of the material is typically removed before the wafer cutting process in order to produce 'pseudosquares' with better solar module packing density. The uniform, unidirectional heat extraction from the bottom of the ingot (instead of from the sides, as in Cz and FZ) allows the solidification of ingots with a cross section of several bricks (at least two and more preferably 4-16), growing the equivalent of 4-16 Cz ingots in parallel. Because of the lack of particulates in the process, together with a flat thermal gradient that minimizes stress concentration, it is believed that linear growth rates can match Cz levels, up to 8 cm/h, producing unparalleled throughput potential for single crystal growth, for example up to 76 kg/h for a 16-brick ingot.

Particulate control is favorable in this process as well. If small foreign particles do arrive on the liquid surface, it is likely that surface tension will keep them there. Normally, Marangoni convection would drive these particles along the surface towards the solid/liquid interface (i.e. the coldest point), but the presence of the induction current in the silicon perimeter should maintain these floating particles in the center of the liquid until such time as they are dissolved in the silicon. In such a way, these particles may increase dissolved impurity levels in the liquid, but should not cause the more serious destruction of the single crystal structure.

Concerning dislocations, it is believed that this process is capable of producing ingots with low levels. It has been demonstrated elsewhere that large area seeds can be used without dislocation nucleation if care is taken to introduce the liquid in a quasi-equilibrium thermal system. The preheating of the seed layer is critical for the success of a dislocation-free seeding process, and the preparation of the seed layer is crucial to avoid introducing large aggregates of dislocations, for example at the seams between seed plates. Most preferably, however, the seed plate is formed from a large single crystal, and not from the joining of smaller seed crystal plates. A successfully grown ingot from this process will certainly allow for the cutting off of one or more seed plates to be used in subsequent ingots.

From the ingot grown according to the previously described process wafers can be cut, which have a number of advantageous features. The wafers are monocrystalline. They have a dislocation density smaller than that of wafers cut from ingots grown according to a vertical gradient freeze (VGF-) process. The dislocation density of the wafers is in particular smaller than $10^3$ cm$^{-2}$, in particular smaller than $10^2$ cm$^{-2}$. At the same time, the wafers differ from wafers cut from Czochralsky grown crystals. The wafers have a dislocation density which typically is at least 1 cm$^{-2}$, in particular at least 5 cm$^{-2}$, in particular at least 10 cm$^{-2}$. The dislocation density can be measured by counting edge pits after the wafer has been subject to Secco etching. This method is known in the art: For background details we refer to the article by F. Secco d'Aragona in *Journal of the Electrochemical Society*, 119, 948 (1972).

Furthermore, by controlling the shape of the phase boundary during crystallization of the ingot, it can be insured that the phase boundary is basically flat. It shows a bending of less than 5 mm. In particular, it shows a bending of less than 5 mm over an area of at least 156 mm×156 mm. This can also be seen from the wafers. The bending or deflection of the phase boundary can in particular be seen, measured and reconstructed from striations seen on the surface of the ingot and thus on the surface of the wafers. Such striations can be measured by lateral photovoltage scanning.

The silicon of the wafers can have an interstitial oxygen content of less than $5\times10^{16}$ atoms per cm$^3$. They can have a nitrogen content of less than $1\times10^{15}$ atoms per cm$^3$. This includes single Nitrogen atoms, Nitrogen dimers N—N and triplets out of two Nitrogen atoms and one oxygen atom N—N—O.

According to the invention the ingots are large enough to divide them into four separate axially oriented columns, from which wafers can be cut. Since the striations as well as other structural and electrical properties of the ingots show a rotational symmetry with respect to a central longitudinal axis of the ingots, dividing the ingots into four columns will lead to square wafers, whose properties display a mirror symmetry with respect to one of their diagonals, in particular the striations on the wafer and the resistivity on the wafer can show such a symmetry with respect to one of the diagonals of the wafer.

In addition, since a bending of the phase boundary leads to a variability of the specific resistance across the cross sectional area of the ingot and thus the wafers cut from it, the wafers which are cut from the ingots produced according to the process according to the present invention have a low variability of the specific resistance across their surface. If the surface of the wafer is divided into four quarters, the variability of the specific resistance across the surface of a wafer is in particular in at least three quarters, in particular across the entire surface, less than 5%, in particular less than 3%. The specific resistance can be in the range of 1 Ωcm to 5 Ωcm, in particular in the range of 1.5 Ωcm to 3 Ωcm. Thus, the variation of the resistivity in at least three quarters, preferably in all four quarters is less than 0.25 Ωcm, in particular less than 0.1 Ωcm, preferably less than 0.06 Ωcm.

The wafers can have a size of more than (140 mm)$^2$, in particular more than (156 mm)$^2$, in particular more than (180 mm)$^2$, in particular more than (200 mm)$^2$, in particular more than (250 mm)$^2$, in particular more than (300 mm)$^2$.

One final advantageous element of this process is the static nature of the hot zone. During typical operation, the liquid height, volume and position are all basically static with respect to the heaters and insulation. The only changing variable in the system is the height of the grown ingot and the corresponding distance of the liquid from the cooling apparatus 9. In order to maintain a quasi-static thermal gradient through the course of the process, the temperature of the cooling block should steadily decrease as it descends. Furthermore, to maximize the process stability, it is important to introduce the feedstock liquid in a way that minimally perturbs the liquid surface, and in as continuous a flow as possible. Due to the static melt volume, there is no axial dopant concentration variation present in the major part of the ingot grown. Thus, the ingot has a constant, i.e. homogenous dopant concentration along its axis.

Figure 2:
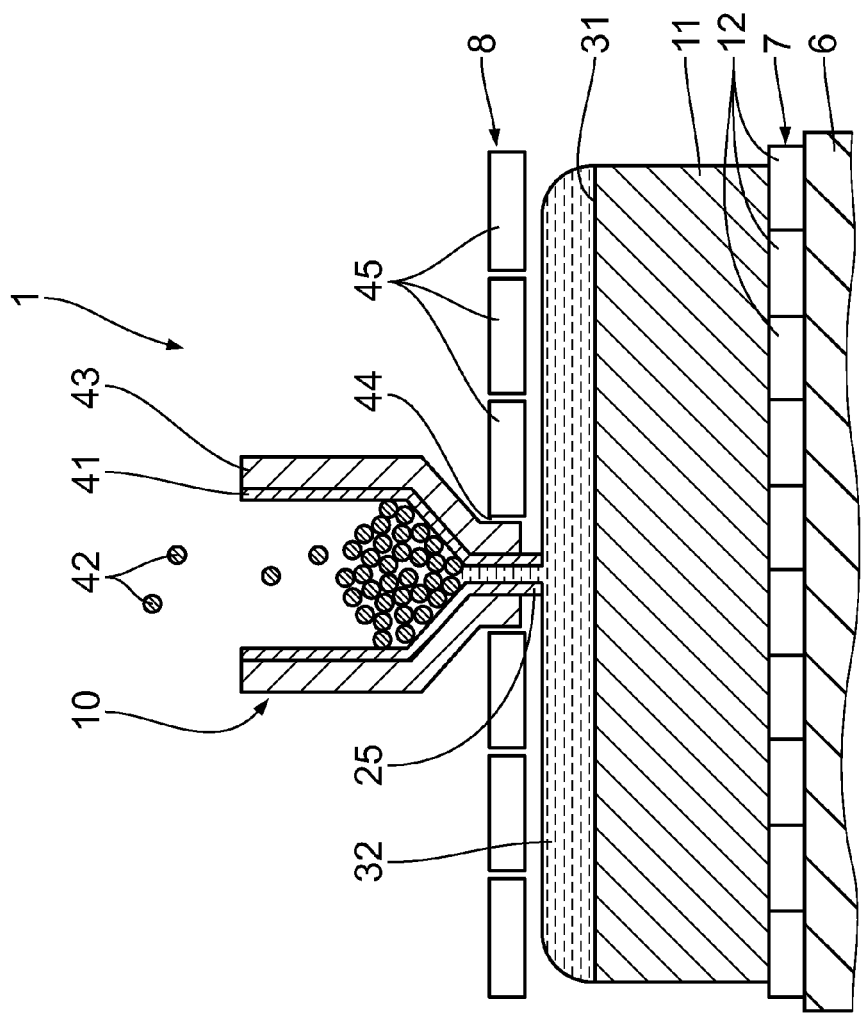
FIG. 2 shows a schematic sectional partial view of another embodiment of the invention.

In the following further details of the apparatus 1 and alternative embodiments of some of its parts are described with reference to FIG. 2. According to the embodiment shown in FIG. 2, the feeding apparatus 10 comprises a cylindrical container 41 for the containment and melting of pieces 42 of solid silicon. The container 41 can be made of quartz glass. In its lower part the container 41 can be funnel shaped. It comprises the feed tube 25. The cylindrical part, the funnel shaped part and the feed tube 25 can be made in one piece.

The container 41 is surrounded by a heating device 43 for heating and melting the pieces 42 of solid silicon. The thus melted silicon can flow via the feed tube 25 through a central opening 44 in the top heater 8 to the layer 32 of liquid silicon. The layer 32 forms a molten cap at the upper end of the already solidified silicon block 11.

The top heater 8 is designed to heat the molten cap. It comprises three different, independently controllable segments 45. A different number of segments 45 is also possible. The heater 8 comprises preferably at least two, in particular in particular at least three segments 45. The heater 8 has a geometry, which corresponds to and determines the cross sectional area of the solidifying silicon block 11. Further details of the heater 8 will be described later.

Figure 3:
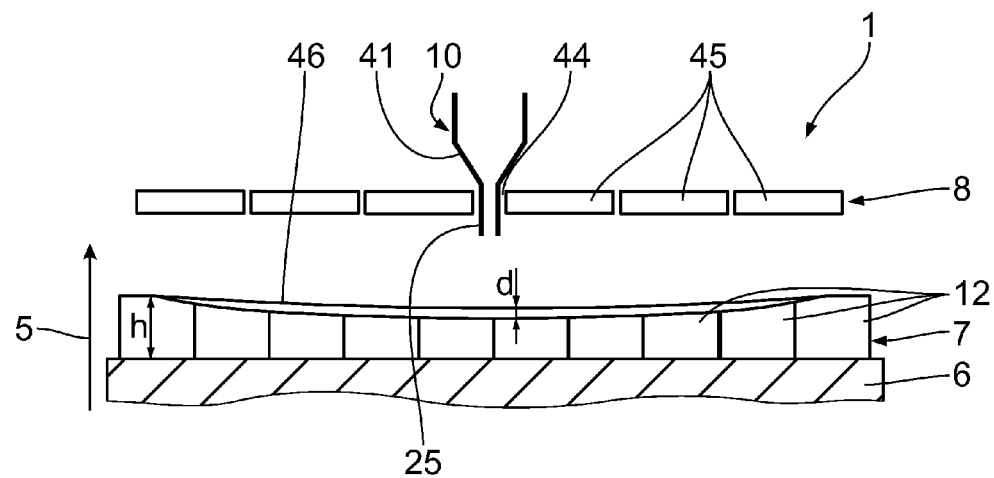
FIG. 3 shows a simplified view of the embodiment according to FIG. 2 at the beginning of the process.
Figure 4:
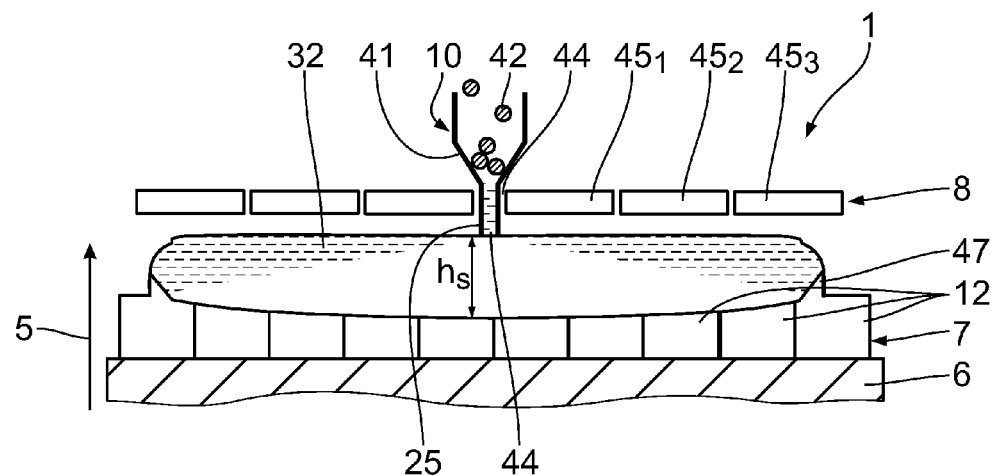
FIG. 4 shows a view according to FIG. 3 a little bit later but still during the initial phase of the process.

In the following some details of the method will be described with reference to FIGS. 3 and 4 in more detail.

At the beginning of the process the seed plates 12 are arranged on the support 6 to form the seed layer 7. By activation of the top heater 8 a shallow melt pool 46 is formed on the upper surface of the seed layer 7.

The seed plates 12 preferably have a monocrystalline structure.

Whereas the seed plates 12 have a height h in the longitudinal direction 5 in the range of 1 cm to 3 cm, in particular in the range of 2.5 cm to 3 cm, the melt pool 46 has a depth d in the range of 0.1 mm to 3 mm, in particular in the range of 0.5 mm to 2 mm.

Preferably the extension of the seed layer 7 in direction perpendicular to the longitudinal direction 5 is larger than that of the top heater 8.

After the melt pool 46 has been formed, liquid silicon is added via the feed tube 25 through the central opening 44 in the top heater 8. Because of the high surface tension of liquid silicon a molten cap with a maximum height $h_S$ of up to about 8 mm forms. The position of the pedestal 13, which is not shown in FIG. 3 and FIG. 4, is adjusted such that there is a distance between the surface of the layer 32 of liquid silicon and the top heater 8, which is in the range of 0.5 cm to 2 cm.

The top heater 8 is controlled, such that the heating power of a central segment $42_1$ is higher than the heating power in a middle segment $42_2$, which again is higher than the heating power in an outermost segment $45_3$. Due to the decreasing heating power in radial direction the lateral extension of the molten cap is limited. Thus, even if more liquid feedstock is added by the feeding apparatus 10, the layer 42 of liquid silicon solidifies at its outermost border. Thus it forms a lateral confinement 47 or inherent crucible on its own.

It was realized, that the larger the radial gradient of the heating power, the better is the correspondence between the cross sectional area, in particular the cross sectional shape of the solidifying silicon block 7 and the geometry of the top heater 8. It was in particular realized, that the lateral part of the molten cap must not be heated to much.

It was further realized, that the lateral extension, that is the extension in direction perpendicular to the longitudinal direction 5, of the solidifying silicon-block 11 depends, among other, on the meniscus angle of the layer 32 of liquid silicon on top of the already solidified silicon-block 11. As schematically depicted in the FIGS. 10a to 10c, there are three possible situations: a) If the meniscus angle with respect to the longitudinal direction 5 is smaller than 8 degree, the diameter of the solidifying silicon-block 11 will decrease; b) if the meniscus angle with respect to the longitudinal direction 5 is equal to about 10 degree, the solidifying silicon-block 11 will grow with constant diameter and c) if the meniscus angle with respect to the longitudinal direction 5 is larger than 12 degree, the solidifying silicon-block 11 will grow with increasing diameter. Hereby it has been assumed, that the meniscus angle is being held constant throughout the process by adjusting at least one of the rate or lateral displacement of the pedestal 13 and the rate of adding liquid silicon feedstock to the layer 32. Preferably, the pedestal 13 is lowered throughout the process with a constant velocity. Preferably, also the rate of adding liquid feedstock is held constant throughout the process. Most preferably the rate of growth of the silicon-block 11 is constant throughout the process.

It was further realized, that the meniscus angle depends on the hydrostatic pressure at a triple point 48, where the solid silicon-block 11, the liquid layer 32 and the gasses surrounding meet. The hydrostatic pressure at the triple point 48 itself depends on the height $h_S$ of the molten cap. There is an optimal value h* of the height $h_S$ of the molten cap, which leads to a meniscus angle=10°. If $h_S=h_1<h^*$, the hydrostatic pressure is smaller, which leads to a smaller meniscus angle (cf. FIG. 10a). On the other hand if $h_S=h_3>h^*$ than meniscus angle is larger than 10° (cf. FIG. 10c). Thus, by adjusting the height $h_S$ of the liquid layer 32 at the triple point 48 the growth of the diameter of the silicon-block 11 can be controlled. The optimal value h* of the height $h_S$ depends also on the electrostatic pressure exerted by the electromagnetic field from the top heater 8.

According to the invention the growth of the diameter of the silicon-block 11 is self stabilized due to the lateral gradient of the heating power of the top heater 8. That means, if the height $h_S$ of the layer 32 at the triple point 48 is temporarily larger than h*, a situation, which can occur for example due to local fluctuations of the convection in the layer 32, the silicon-block 11 will grow with increasing diameter. This will lead to the situation, that the triple point 48 will move into an area of increasingly lower temperature, leading to an increase in growth velocity, which again will lead to a reduction of the height $h_S$ of the liquid layer 32, thus, reducing the increase in diameter.

An analog situation occurs, if the silicon-block 11 locally grows with decreasing diameter.

It was further realized, that when growing a silicon-block 11 with a square cross sectional area, special provisions are necessary to account for the variation of radiative losses over its surface. In particular, due to geometric reasons, the solidifying silicon-bock 7 will loose more energy by radiation at its corners than in the areas at the midpoints of its sides. Without suitable provisions this would lead to a faster crystallisation around the corners, thus leading to an relative upwards shift of the position of the triple point 48 in these areas, which again would lead to a decrease in the diameter of the silicon-block 11 in these areas. In other words, it would lead to rounded corners of the silicon-block 11. More generally, without suitable provisions the growing silicon-block 11 would have a tendency to assume a round shape.

Furthermore, it was realized, that due to the growth of the silicon-block 11 and the associated increase in radiation of heat via its sides, the silicon-block 11 will show a tendency to have a decreasing diameter with increasing height.

In the following a number of possibilities to counteract such a change in shape or diameter will be described.

According to an aspect of the invention the heating power of the top heater 8 is increased during the growth process. By suitable control of the heating power of the top heater 8 it is thus possible to grow silicon-blocks 11 with constant cross sectional area over their entire height.

In an alternative, easier embodiment, the heating power of the top heater 8 is kept constant throughout the growth process of the silicon-block 8.

Figure 5:
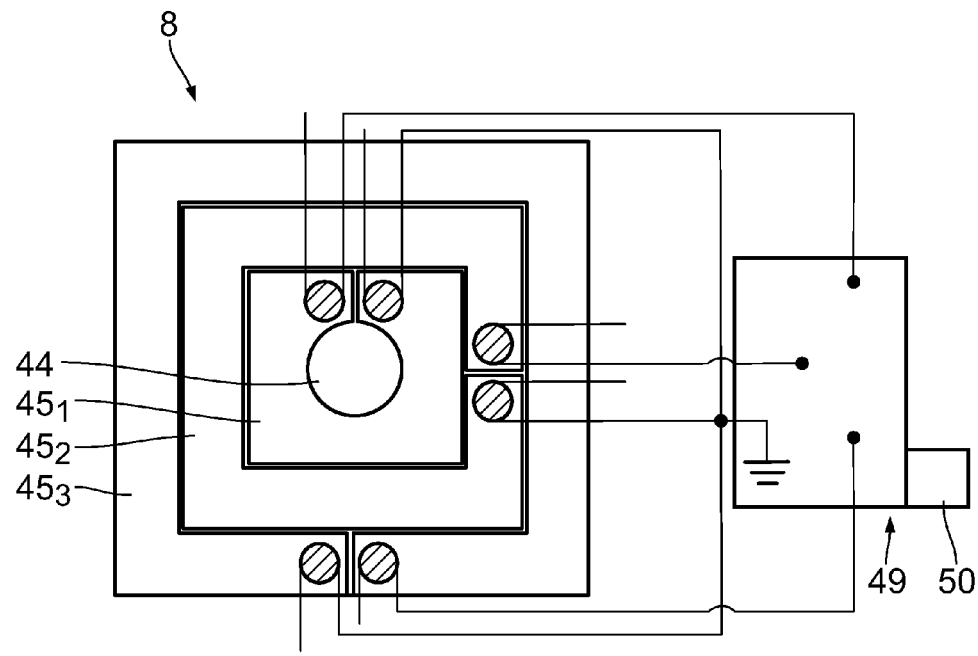
FIG. 5 shows schematically an embodiment of a top heater and its electrical connection.
Figure 6:
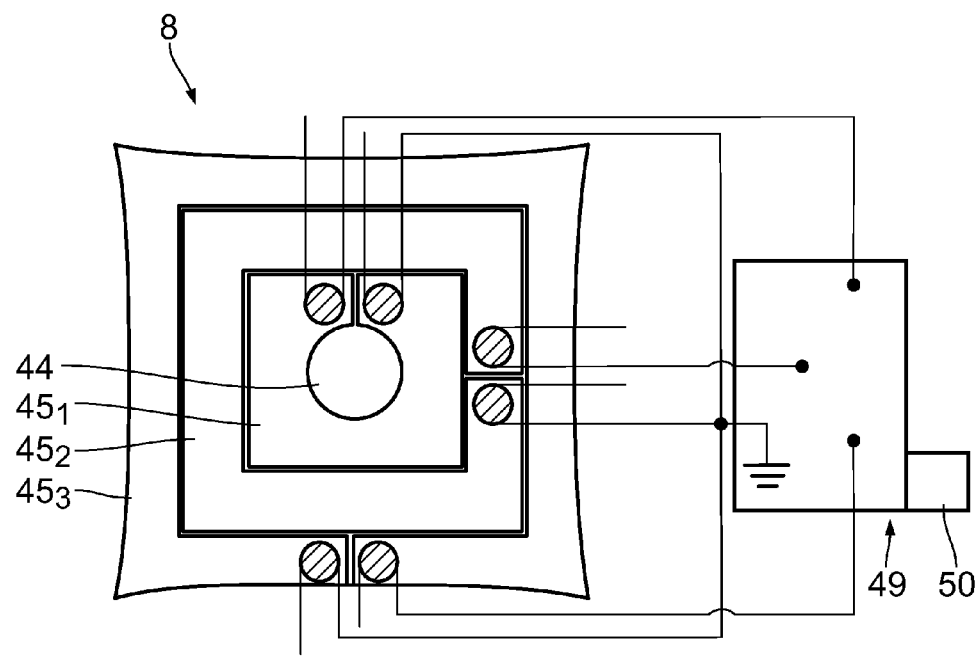
FIG. 6 shows a view according to FIG. 5 of a different embodiment of a top heater.
Figure 7:
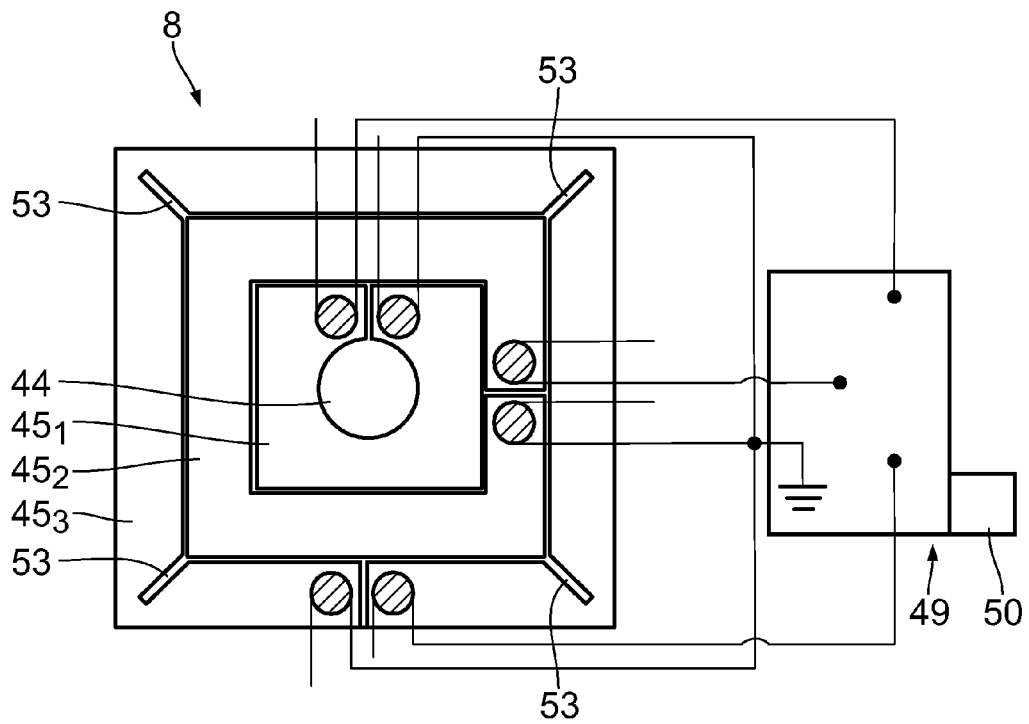
FIG. 7 shows a view according to FIG. 5 of yet another embodiment of a top heater.

In the following some embodiments of the top heater 8 are described in more detail. As described above, the top heater 8 comprises three segments $45_1$, $45_2$, $45_3$. The segments 45 are formed by loops or windings. They have a square outer and inner circumference. They are arranged concentrically to each other and concentrically to the central opening 44. Each of the segments 45 is connected to a power source 49 as schematically shown in FIG. 5 to FIG. 7. The power source 49 comprises a source for AC-power and a source for DC-power and a controller 50. Each of the segments 45 is connected to both, the AC-power source and the DC-power source. The segments 45 are connected to the power source 49 by a delta-connection or a star connection.

The AC-power source can generate AC-power with a frequency in the range of 10 Hz to 100 kHz. The frequency can in particular be larger than 1000 Hz, in particular larger than 3000 Hz, in particular larger than 10000 Hz, since a large depth of penetration is not necessary due to the shallow-ness of the liquid layer 32. It has been found, that advantageously, the depth of penetration corresponds to the height $h_S$ of the layer 32. In general it is ensured, that the depth of penetration is large enough to prevent the formation of vertical convection roles.

Figure 8:
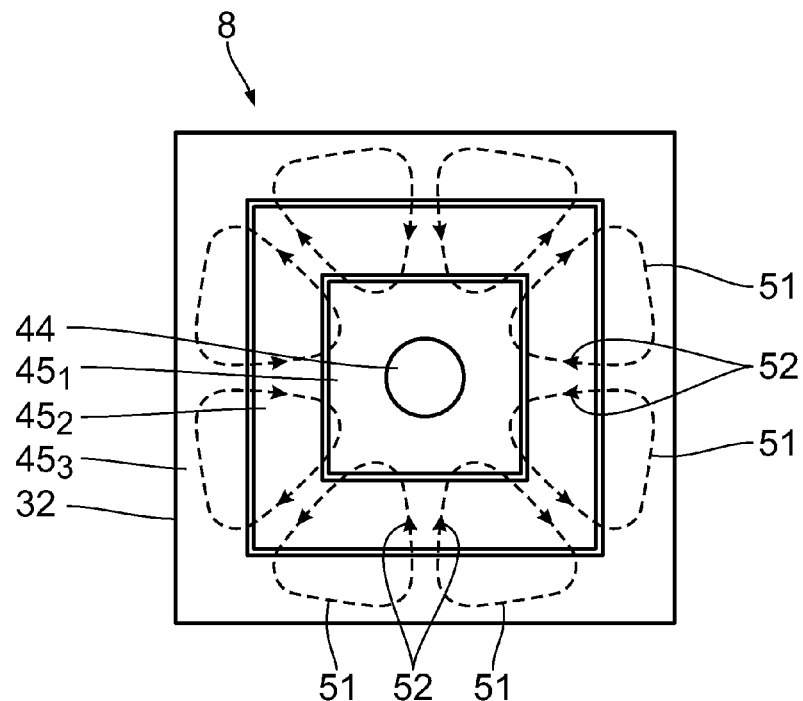
FIG. 8 shows schematically a flow pattern which can be generated in the liquid layer by a top heater according to the invention.

The power supplied to each of the segments 45 is independently controllable by the controller 50. The main heating power of the segments 45 can be provided by the DC-power source. The AC-power can be used to generate a fluctuating electromagnetic field, in particular a travelling field or travelling wave. The electromagnetic travelling field can used to induce a flow pattern in the liquid layer 32. An exemplary flow pattern is shown in FIG. 8, in which eddies 51 in the liquid layer 32 are depicted together with a direction of flow 52.

The top heater 8 is preferably made of graphite, in particular ultrapure graphite. It can also be made of carbon-fiber-reinforced carbon (CFC). It can be coated with silicon carbide (SiC). Such a coating is advantageous to prevent evaporating silicon oxide (SiO) to react with the graphite and thus to form loose layers of SiC.

The top heater 8 can be mounted and held in place by structures of boron nitride (BN). The structures for mounting and holding the top heater 8 are in particular of a material which is mechanically stable also at temperatures of about 1400° C. to 1500° C. Furthermore, the material of the mounting structures for the top heater 8 is electrically isolating even at such temperatures.

In order to generate the aforementioned travelling field the different segments $45_1$, $45_2$, $45_3$ are activated with a phase shift of 120°.

The direction of the travelling field can be reversed by mutually exchanging two of the phases or by shifting the phases in the segments 45 suitably.

Whereas according to the embodiment shown in FIG. 5 all of the segments 45 of the top heater 8 have a square shape in an advantageous embodiment of the top heater 8, which is shown in FIG. 6 only the central segment 45$_1$ and the middle segment 45$_2$ have a square shape. The outer segment 45$_3$ has a square inner circumference. However its outer circumference is slightly concave, i.e. the outermost borders of the top heater 8 bend slightly inwards. By this, it is possible to increase the heating power in the corners relative to the heating power at the midpoints of the outer boundary of the top heater 8.

According to a different embodiment, which is shown in FIG. 7, the outermost segment 45$_3$ has four slits 53 extending from the corners of the inner circumference along the diagonals of the square outer circumference. By this, the current density in the corners of the outermost segment 45$_3$ is increased.

Alternatively or additionally an increase of radiative heat loss at the corners of the solidifying silicon-block 11 can be compensated by at least one of suitable reflectors and an increased thermal insulation in these areas.

Figure 11:
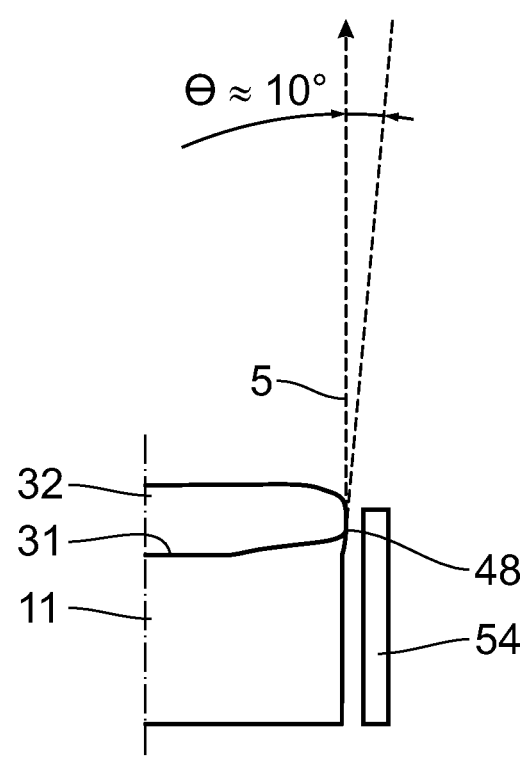
FIG. 11 shows a view according to FIG. 10*b* with an indication of a more realistic phase boundary.

As shown in FIG. 11 a temperature gradient in the longitudinal direction at the triple point 48 will lead to a curved shape of the solidification line 31. In particular, the solidification line 31 will bend upwards with increasing distance from the centre. According to another aspect of the invention such upward bending of the solidification line 31 is compensated for example by an increase of the heating power applied to the outermost segment 45$_3$ of the heater 8. It can also be compensated by suitable insulation elements 54.

The heating power supplied to the segments 45 of the top heater 8 by the power source 48 can be constant throughout the solidification process. However, in an advantageous embodiment, the heating power can be varied over the solidification process. It can be controlled by the controlling device 50. The controller of the heating power can take part in an open loop or a closed loop circuit.

It is in particular possible to vary the power supplied to the segments 45 in order to generate predefined flow patterns in the liquid layer 32. This can be advantageous to insure a homogeneous distribution of dopants in the solidifying silicon-block 11.

It is in particular possible to generate a flow pattern, which is schematically depicted in FIG. 8, wherein there is a flow from a central part of the liquid layer 32 to its corners and a reverse flow to the centre along the midlines of the approximately square shaped liquid layer 32. Combined with an increased heating power supplied to the central segment 45$_1$ of the top heater 8 such a flow pattern will lead to a transport of comparatively hot liquid to the corners, which can prevent the solidification line 31 to bend upwards. Of course, the flow pattern can be reversed, if necessary, in order to transport comparatively cold liquid from the periphery of the liquid layer 32 to the corners. Thus, according to an aspect of the invention, it is possible to control the shape, in particular the cross sectional area, of the solidifying silicon-block 11 by controlling at least one of the heating power supplied to the segments 45 of the top heater 8 and by controlling the AC-power supplied to the segments 45 of the top heater 8 in order to generate a specific flow pattern in the liquid layer 32.

Figure 9:
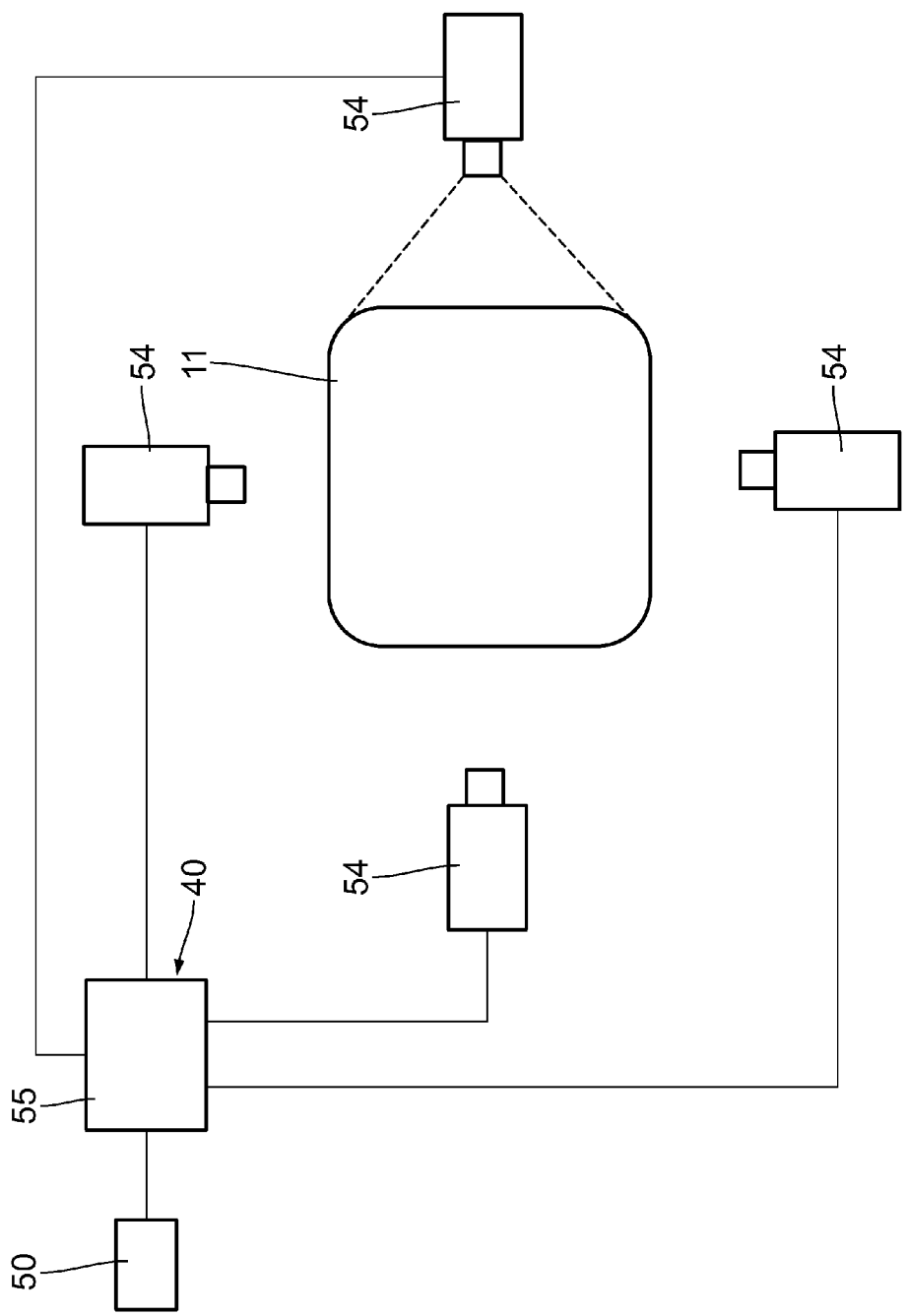
FIG. 9 shows schematically an embodiment of a monitoring apparatus for monitoring the solidifying liquid layer, FIG. 10*a* to FIG. 10*c* shows schematically the solidifying liquid layer to visualize the influence of the angle of the meniscus on the growth of the crystal.

In an advantageous embodiment the shape of the solidifying silicon-block 11, in particular the three dimensional position of the solidification line 31 is monitored by a monitoring apparatus 40. As schematically shown in FIG. 9 the monitoring apparatus 40 comprises four monitoring devices in form of cameras 54. Each of the cameras is connected to a central monitoring unit 55. The central monitoring unit 55 is again connected to the controller 50. By that, the AC-power and DC-power supplied to the segments 45 of the top heater 8 can be controlled in a closed loop.

According to the embodiment shown in FIG. 9 there is one camera 54 positioned on each side of the solidifying silicon-block 11. In principle it is also possible to have only two cameras 54, which are positioned obliquely, in particular perpendicular to each other. For the diameter control, it is convenient to have one camera positioned to look obliquely down the length of one side of the ingot (i.e. positioned off-center) for diameter control.

The central monitoring unit 55 can comprise a processor to determine a value, in particular a mean value from the signals of each of the cameras 54 to provide a measure of at least one of the diameter or cross sectional area of the solidifying silicon-block 11, the diameter or cross sectional area of the liquid layer 32, the height $h_S$ of the liquid layer 32, the meniscus angle of the liquid layer 32 at the triple point 58 and the shape, in particular the bending of the solidification line 31.

The central monitoring unit 55 can also be connected to the feeding apparatus 10 to control the rate of adding liquid feedstock to the liquid layer 32.

The top heater 8 according to the embodiments shown in FIGS. 5 to 7 and the monitoring apparatus 40 can be advantageously combined with at least one of the perimeter heater 26 and the perimeter cooler 30 described above. In particular, the central monitoring unit 55 of the monitoring apparatus 50 can be connected with a controlling device to control the AC-power supplied to the perimeter heater 26 by the AC-power source 29. It can also be connected to a controlling device for controlling the supply of cooling fluid from the reservoir 33 to the perimeter cooler 30.

According to a further aspect of the invention the position of the feed tube 25 of the feeding device 10 is adjustable relative to the support 6, in particular relative to the upper surface of the liquid layer 32. According to an aspect of the invention the position of the tip of the feed tube 25 is adjusted, such that it reaches into the liquid layer 32 (cf. FIG. 2). By this the development of surface waves due to an intermittent contact between liquid feedstock from the feed tube 25 and the liquid layer 32, can be avoided.

What is claimed is:

1. An apparatus for the production of ingots, the apparatus comprising:
   a chamber to provide a controllable atmosphere, wherein the chamber has a top and a bottom spaced apart from each other in a longitudinal direction;
   a support for supporting a seed layer, wherein the support is movable in the longitudinal direction relative to the chamber;
   at least one means for controlling a temperature field in a given volume of growth in the chamber, wherein the temperature field has a temperature gradient in the longitudinal direction; and
   a feeding apparatus for controllable feeding of material onto the seed layer, wherein the at least one means for controlling the temperature field comprises at least one top heating apparatus arranged above the support for the seed layer, wherein the top heating apparatus is designed to generate a temperature field with a temperature gradient in a direction perpendicular to the longitudinal direction, wherein the gradient in the longitudinal direction is in a range of 100 K/m to 10000 K/m and the gradient in a lateral direction is at most 1 K/cm.

2. An apparatus according to claim 1, wherein the at least one top heating apparatus comprises at least two heating loops, wherein the at least two heating loops are arranged concentrically, wherein each of the heating loops is connected to a power source providing at least one of a DC power and an AC power, and wherein each of the heating loops is independently controllable.

3. An apparatus according to claim 1, wherein the at least one means for controlling the temperature field comprises at least one bottom cooling apparatus arranged below a containment tray, which is part of the support for the seed layer.

4. An apparatus according to claim 1, wherein at least one of said top heating apparatus and a bottom cooling apparatus is designed to control the temperature gradient in the lateral direction in the volume of growth.

5. An apparatus according to claim 1, further comprising at least one perimeter heater having an inner perimeter matching the shape of an outer perimeter of the seed layer, wherein the perimeter heater comprises an inductive heating coil of one or more turns.

6. An apparatus according to claim 5, wherein the cross-sectional shape of the seed layer and perimeter heater are rectilinear, having basically straight sides at roughly 90 degrees to one another, rounded corners with a radius of at least 1 mm and the seed layer is laterally positioned to fit within the cross-section of the perimeter heater.

7. An apparatus according to claim 5, further comprising at least one perimeter cooler having an inner perimeter matching an outer perimeter of the seed layer, wherein the perimeter heater is arranged above the perimeter cooler.

8. An apparatus according to claim 1, wherein the apparatus is crucibleless.

9. An apparatus according to claim 1, wherein the lateral temperature gradient is controllable.

* * * * *